(12) United States Patent
Hagiwara (10) Patent No.: US 7,164,460 B2
(45) Date of Patent: Jan. 16, 2007

(54) MOUNTING STRUCTURE FOR SEMICONDUCTOR DEVICE, ELECTRO-OPTICAL DEVICE, AND ELECTRONIC APPARATUS

(75) Inventor: Takeshi Hagiwara, Matsumoto (JP)

(73) Assignee: Seiko Epson Corporation (JP)

( * ) Notice: Subject to any disclaimer, the term of this patent is extended or adjusted under 35 U.S.C. 154(b) by 182 days.

(21) Appl. No.: 09/790,985

(22) Filed: Feb. 22, 2001

(65) Prior Publication Data

US 2001/0033355 A1    Oct. 25, 2001

(30) Foreign Application Priority Data

Feb. 24, 2000    (JP)    ............... 2000-048041

(51) Int. Cl.
 *G02F 1/1345* (2006.01)
 *H01L 21/00* (2006.01)

(52) U.S. Cl. .............. 349/149; 349/152; 349/151; 438/30

(58) Field of Classification Search ........ 349/149–152, 349/158, 139; 438/30, 25, 26
See application file for complete search history.

(56) References Cited

U.S. PATENT DOCUMENTS

| | | | | |
|---|---|---|---|---|
| 5,592,199 | A * | 1/1997 | Kawaguchi et al. ........ | 345/206 |
| 5,768,105 | A * | 6/1998 | Aota et al. ................. | 361/777 |
| 5,914,763 | A | 6/1999 | Fujii et al. | |
| 5,959,713 | A * | 9/1999 | Kobayashi ................. | 349/192 |
| 6,052,170 | A * | 4/2000 | Kobayashi ................. | 349/149 |
| 6,151,091 | A * | 11/2000 | Muramatsu ................ | 349/149 |
| 6,265,770 | B1 | 7/2001 | Uchiyama | |
| 6,297,868 | B1 * | 10/2001 | Takenaka et al. ........... | 349/151 |
| 6,300,997 | B1 * | 10/2001 | Saito et al. ................. | 349/149 |
| 6,356,333 | B1 * | 3/2002 | Uchiyama .................. | 349/149 |
| 2002/0060767 | A1 * | 5/2002 | Muramatsu et al. ........ | 349/139 |

FOREIGN PATENT DOCUMENTS

| | | | |
|---|---|---|---|
| CN | 1235375 | | 11/1999 |
| JP | 52-72567 | | 6/1977 |
| JP | 60-146225 | * | 1/1985 |
| JP | 60-146225 | | 8/1985 |
| JP | 61-149348 | | 9/1986 |
| JP | 61-215528 | * | 9/1986 |
| JP | 05-210107 | | 8/1993 |
| JP | 6-4606 | | 2/1994 |

(Continued)

OTHER PUBLICATIONS

Korean Notice of Preliminary Rejection.

(Continued)

*Primary Examiner*—Andrew Schechter
*Assistant Examiner*—Mike Qi
(74) *Attorney, Agent, or Firm*—Harness, Dickey & Pierce, P.L.C.

(57) ABSTRACT

In an IC mounting region 70 of a substrate 20 constituting a liquid crystal device, first terminals 91A, 91B, and 91C are divided into a plurality of terminals 911A, 912A, 913A, 914A, 921B, 922B, 921C, and 922C by slits 96 formed of portions where an ITO film forming wiring patterns 91 and the first terminals 91 is not formed. For this reason, when the first terminals 91 and first electrodes 71 are electrically and mechanically connected by an anisotropic conductive film, a resin component contained in the anisotropic conductive film fixedly bonds a driving IC 7 to the second transparent substrate 20 while it enters the slits 96. Since the area of the resin component 61 of the anisotropic conductive film in contact with the first terminals 91 is large, fixing strength of the IC 7 is increased.

28 Claims, 10 Drawing Sheets

FOREIGN PATENT DOCUMENTS

| | | |
|---|---|---|
| JP | 06-051349 | 2/1994 |
| JP | 06-333662 | 12/1994 |
| JP | 07-225392 | 8/1995 |
| JP | 08-045381 | 2/1996 |
| JP | 8-201833 * | 8/1996 |
| JP | 08-201833 | 8/1996 |
| JP | 08-313925 | 11/1996 |
| JP | 09-260579 | 10/1997 |
| JP | 10-209202 | 8/1998 |
| JP | 11-145373 | 5/1999 |
| JP | 11-284030 | 10/1999 |

OTHER PUBLICATIONS

Examination Report from corresponding Japanese Application.

Communication from Chinese Patent Office regarding counterpart application.

* cited by examiner

PRIOR ART

MOUNTING STRUCTURE FOR SEMICONDUCTOR DEVICE, ELECTRO-OPTICAL DEVICE, AND ELECTRONIC APPARATUS

BACKGROUND OF THE INVENTION

1. Technical Field of the Invention

The present invention relates to a mounting structure for a semiconductor device (hereinafter referred to as an "IC"), an electro-optical device using the mounting structure, and an electronic apparatus using the electro-optical device as a display. More particularly, the present invention relates to a terminal structure in a mounting structure, using an anisotropic conductive film.

2. Description of the Related Art

Liquid crystal devices are typical of electro-optical devices. For example, in a passive matrix liquid crystal device 1 shown in FIGS. 1, 2, and 3 among the liquid crystal devices, a first transparent substrate 10 made of glass or the like and a second transparent substrate 20 similarly made of glass or the like are fixedly bonded with a predetermined clearance therebetween so as to hold a sealing material 30 therebetween. Between the first transparent substrate 10 and the second transparent substrate 20, liquid crystal 5 is sealed in a liquid crystal sealing region 300 enclosed by the sealing material 30. The first transparent substrate 10 and the second transparent substrate 20 are provided, respectively, with electrode patterns 15 and 25 for driving which extend in orthogonal directions so as to apply voltage to the liquid crystal.

Figure 1:
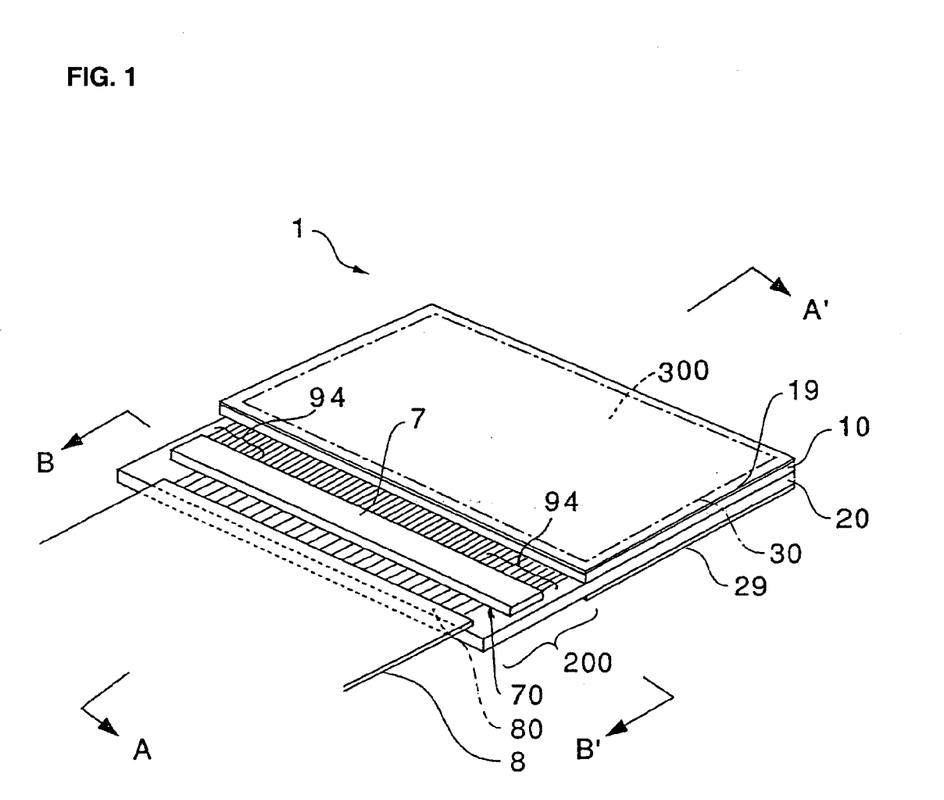
FIG. 1 is a perspective view schematically showing the external appearance of a liquid crystal device.
Figure 2:
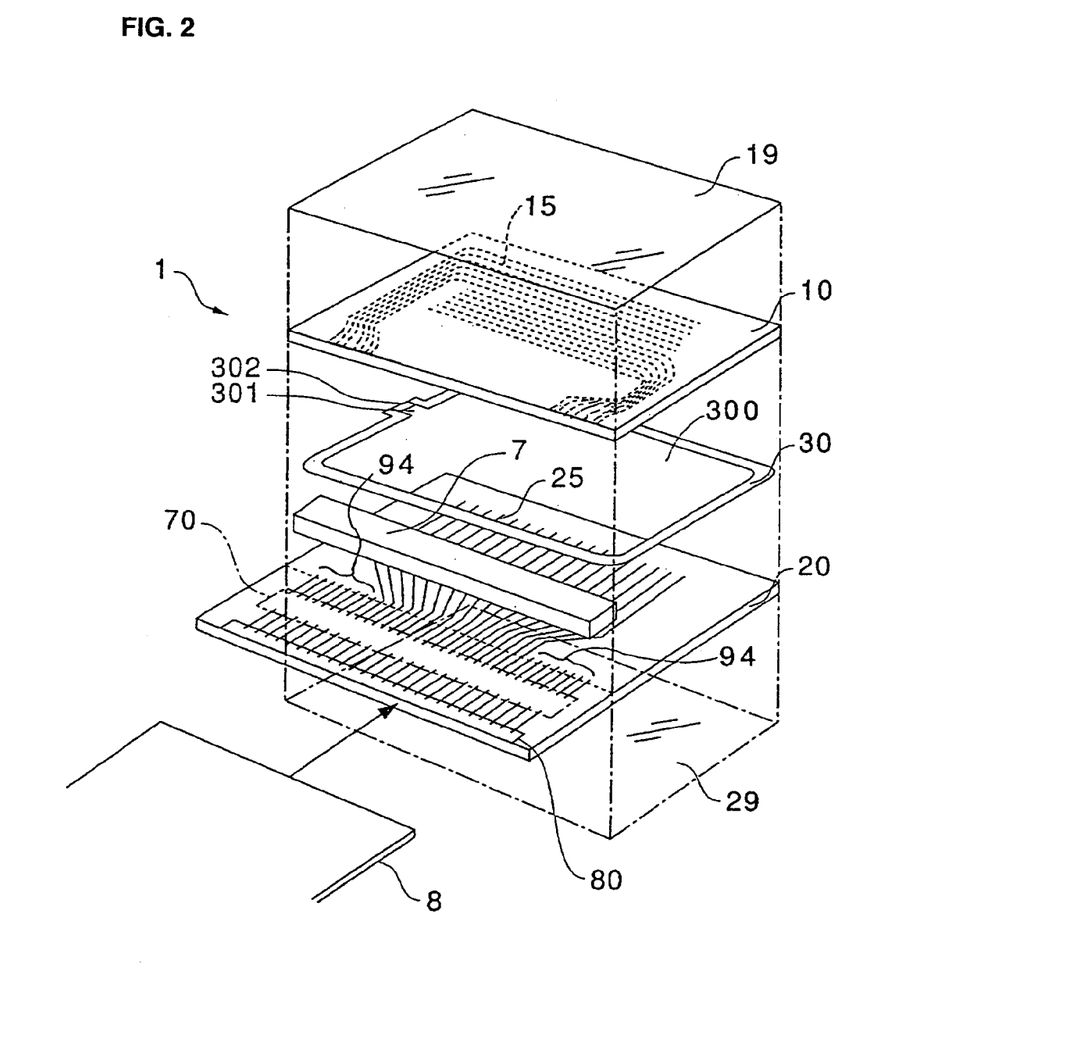
FIG. 2 is a perspective view schematically showing an exploded state of the liquid crystal device shown in FIG. 1.
Figure 3:
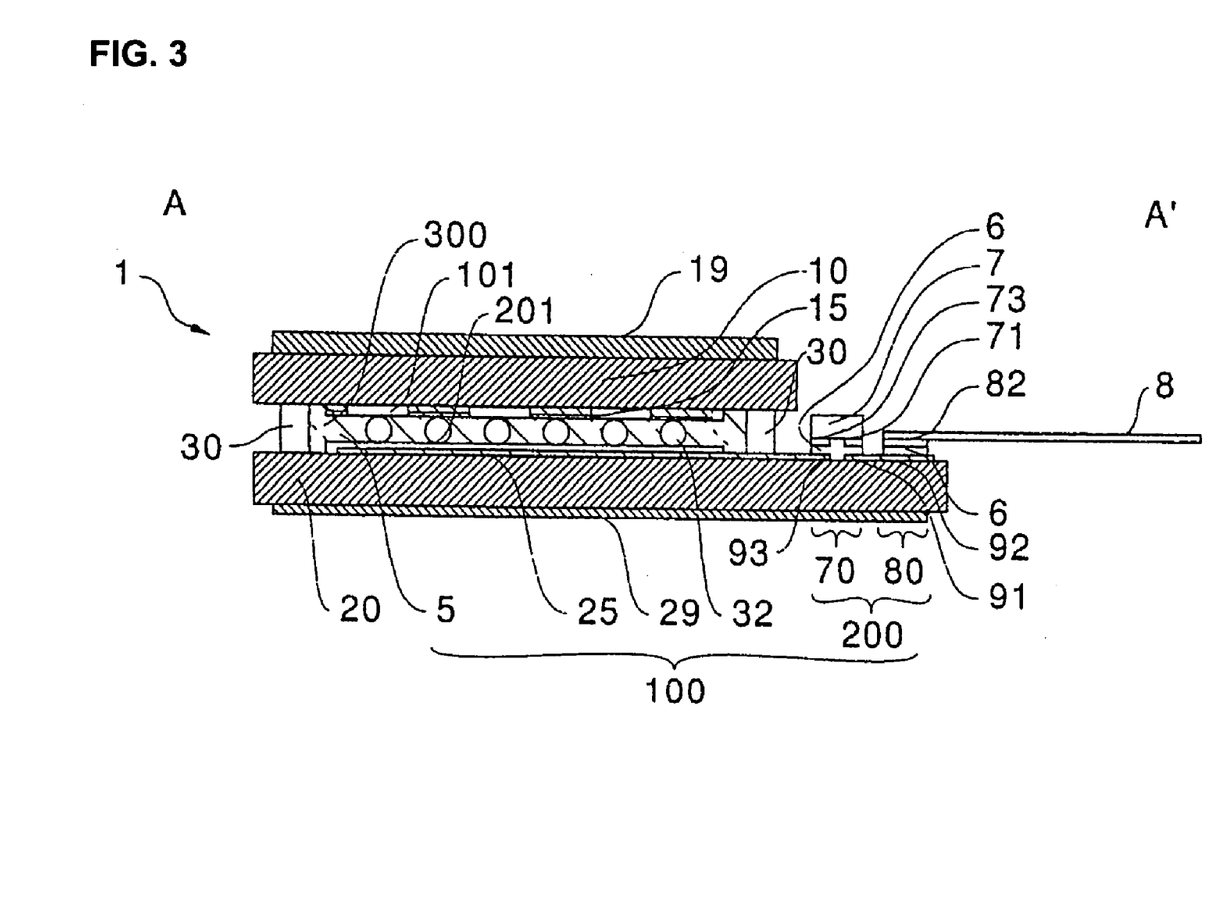
FIG. 3 is a cross-sectional view of the liquid crystal device, taken along line A–A' in FIG. 1.

In the liquid crystal device, since the second transparent substrate 20 is larger than the first transparent substrate 10, a portion thereof protrudes from the edge of the first transparent substrate 10. The protruding portion 200 of the second transparent substrate 20 has an IC mounting region 70, where a driving IC (semiconductor device) 7 for outputting driving signals to the electrode patterns 15 and 25 is mounted, and a flexible wiring board connecting region 80 that connects a flexible wiring board 8 for supplying various signals and voltages to the driving IC 70.

The electrode patterns 25 formed on the second transparent substrate 20 extend from the IC mounting region 70, and signals are directly supplied thereto from the driving IC 7 mounted in the IC mounting region 70. In contrast, the electrode patterns 15 formed on the first transparent substrate 10 are electrically connected to the ends of wiring patterns 94 for conduction between the substrates, which extend from both ends of the IC mounting region 70 of the second transparent substrate 20, via an intersubstrate conducting material contained in the sealing material 30 when the first transparent substrate 10 and the second transparent substrate 20 are bonded by the sealing material 30.

Figure 9:
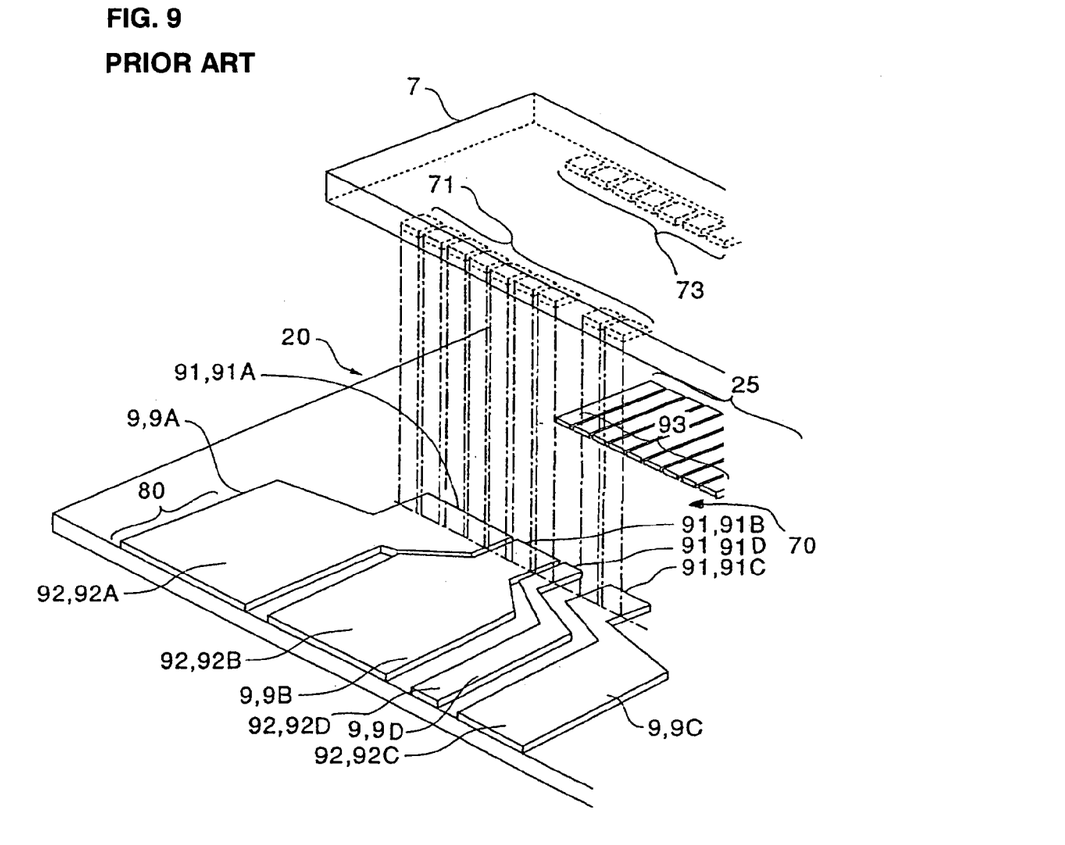
FIG. 9 is a perspective view showing a state in which a driving IC is mounted on an IC mounting region of a second substrate in a conventional liquid crystal device.

In this example, the IC mounting region 70 and the flexible wiring board connecting region 80 are generally structured as shown in FIG. 9 as a partly enlarged view. In the IC mounting region 70, an electrical connection is made between the driving IC 7 and the wiring patterns 25 and an electrical connection is made between the driving IC 7 and the intersubstrate conducting wiring patterns 94 for conduction between the substrates. Since the connections are basically the same in structure, FIG. 9 shows only the electrical connection between the driving IC 7 and the wiring patterns 25 in the IC mounting region 70. Illustration and description of the electrical connection between the driving IC 7 and the intersubstrate conducting wiring patterns 94 are omitted.

In FIG. 9, the IC mounting region 70 and the flexible wiring board connecting region 80 are connected by wiring patterns 9 formed simultaneously with formation of the driving electrode patterns 25. The ends of the wiring patterns 9 placed in the IC mounting region 70 form multiple first terminals 91 (a first terminal group), and are connected to multiple first electrodes 71 (a first electrode group) formed on the active surface of the driving IC 7. The ends of the wiring patterns 9 placed in the flexible wiring board connecting region 80 form multiple second terminals 92 (a second terminal group), and are connected to a second electrode group (not shown) formed on the flexible wiring board 8 (see FIGS. 1, 2, and 3).

Among the plural wiring patterns 9 (9A, 9B, 9C, and 9D), the wiring patterns 9A, 9B, and 9C for supplying voltages, such as a ground potential Vss and a high-voltage potential Vdd, from the flexible wiring board 8 to the driving IC 7 are provided, in the IC mounting region 70, with first terminals 91A, 91B, and 91C which are solid and even wider than a first terminal 91D formed at the end of the wiring pattern 9D. Some of the first electrodes 71 of the driving IC 7 are collectively and electrically connected to each of the terminals 91A, 91B, and 91C. Similarly, the wiring patterns 9A, 9B, and 9C are provided, in the flexible wiring board connecting region 80, with second terminals 92A, 92B, and 92C which are solid and much wider than a second terminal 92D formed at the end of the wiring pattern 9D, and some of the second electrodes of the flexible wiring board 8 are collectively and electrically connected to each of the terminals 92A, 92B, and 92C.

Figure 10A:
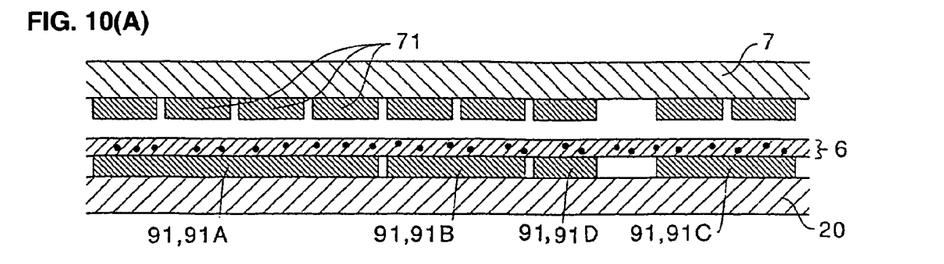
FIG. 10 is a process sectional view schematically showing a state in which the driving IC is mounted on the IC mounting region of the second substrate in the conventional liquid crystal device.
Figure 10B:
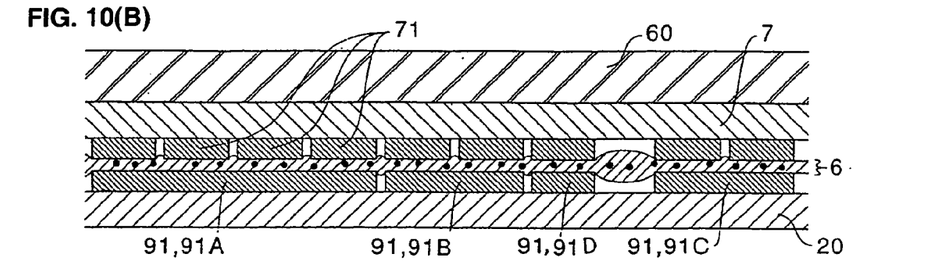
Figure 10C:
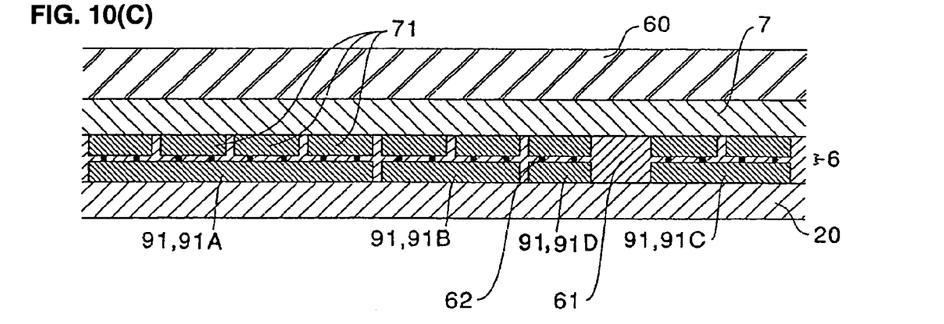

Since the distance between the adjoining electrodes is considerably short, such electrical connections are generally made by using an ACF (Anisotropic Conductive Film). In a mounting method using the anisotropic conductive film, as shown in FIG. 10(A), first, an anisotropic conductive film 6 is applied to the IC mounting region 70, or a sheet-like anisotropic conductive film 6 is placed on the IC mounting region 70. Subsequently, the first electrodes 71 of the driving IC 7 are aligned with the first terminals 91 formed on the second transparent substrate 20. In this state, the driving IC 7 is heated and press-bonded to the second transparent substrate 20 by a head 60, as shown in FIG. 10(B). As a result, a resin component 61 contained in the anisotropic conductive film 6 is melted, and conductive particles 62 contained in the anisotropic conductive film 6 are crushed between the first terminals 91 and the first electrodes 71, as shown in FIG. 10(C). For this reason, the first terminals 91 and the first electrodes 71 are electrically connected via the conductive particles 62, and the driving IC 7 is fixed on the second transparent substrate 20 in a state in which the resin component 61 contained in the anisotropic conductive film 6 is hardened.

As shown in FIG. 9, the second transparent substrate 20 is provided with the electrode patterns 25 for supplying signals output from the driving IC 7 to pixels. The ends of the electrode patterns 25 placed in the IC mounting region 70 form multiple third terminals 93 (a third terminal group). Multiple third electrodes 73 (a third electrode group) formed on the active surface of the driving IC 7 are electrically connected to the third terminals 93. Since the electrical connection in this portion is made simultaneously with the process described with reference to FIG. 9 and the manner thereof is similar to that described with reference to FIG. 9, description thereof is omitted. A method for electrically connecting the flexible wiring board 8 to the flexible wiring board connecting region 80 of the second transparent substrate 20 is nearly similar to that described with reference to FIG. 9. Therefore, description thereof is also omitted.

In such a mounting structure using the anisotropic conductive film 6, mechanical strength of the mounting section is governed by the adhesive force of the resin component 61 contained in the anisotropic conductive film 6. In the conventional mounting structure, when the first terminals 91 formed on the second transparent substrate 20 and the first electrodes 71 formed on the driving IC 7 are reduced in size, the mechanical strength therebetween is significantly decreased.

With such problems in view, an object of the present invention is to provide an IC mounting structure in which mechanical strength of a mounting section using an anisotropic conductive film can be increased by improving the structure of terminals for IC mounting, an electro-optical device, and an electronic apparatus.

SUMMARY OF THE INVENTION

In order to solve the above problems, the present invention provides a semiconductor device mounting structure for mounting a semiconductor device on a semiconductor device mounting region of a substrate, wherein a group of first terminals is provided in the semiconductor device mounting region of the substrate, the semiconductor device has a group of first electrodes to be electrically connected to the group of first terminals by an anisotropic conductive film, and the group of first terminals includes at least a group of divided terminals divided by a slit formed of a portion where a conductive film forming the group of first terminals is not provided.

In the present invention, since the first terminals are divided into a plurality of terminals (divided terminals) in a comb-like form by the slits, they have pits and projections formed by the slits. For this reason, when the first terminals and the first electrodes are electrically and mechanically connected by an anisotropic conductive film, the resin component contained in the anisotropic conductive film fixedly bonds the IC to the substrate while it enters the pits (the slits). Consequently, the area of the resin component in contact with the first terminals is larger, by the areas of the side face portions of the first terminals, than that in the conventional mounting structure. Since this substantially increases the contact area, bonding strength of the IC to the substrate is increased.

In the present invention, for example, predetermined electrodes of the group of first electrodes are placed on the terminals constituting the group of divided terminals in a one-to-one correspondence so as to be electrically connected thereto.

In the present invention, it is preferable that the substrate be provided with a flexible wiring board connecting region having a group of second terminals, that a group of second electrodes on a flexible wiring board be electrically connected to the group of second terminals via an anisotropic conductive film, and that the group of first terminals include at least a group of divided terminals divided by a slit formed of a portions where a conductive film forming the group of second terminals is not provided.

In this way, since the second terminals are also divided in a comb-like form into a plurality of terminals (divided terminals) by slits in the connecting region between the substrate and the flexible wiring board in this aspect, they are provided with pits and projections formed by the slits. For this reason, when the second terminals and the second electrodes are electrically and mechanically connected by an anisotropic conductive film, a resin component contained in the anisotropic conductive film fixedly bonds the flexible wiring board to the substrate while it enters the pits (slits). Consequently, the area of the resin component in contact with the second terminals is increased by the areas of side face portions of the second terminals. Since this substantially increases the contact area, bonding strength of the flexible wiring board to the substrate is increased.

In the present invention, for example, predetermined electrodes of the group of second electrodes are placed on the terminals constituting the group of divided terminals in a one-to-one correspondence so as to be electrically connected thereto.

An IC mounting structure to which the present invention is applied is applicable to, for example, an electro-optical device. In the electro-optical device, a plurality of electrode patterns extend on a substrate so as to supply a driving signal from an IC mounted on an IC mounting region to pixels. Such an electro-optical device may be used as, for example, displays of various electronic apparatuses.

DETAILED DESCRIPTION OF THE PREFERRED EMBODIMENTS

Embodiments of the present invention will be described with reference to the attached drawings. While the present invention has various applications, embodiments, which will be described below, respectively show cases in which the present invention is applied to a liquid crystal device that is most typical of electro-optical devices.

FIG. 1 is a perspective view schematically showing the external appearance of a liquid crystal according to this embodiment, FIG. 2 is a perspective view schematically showing an exploded state of the liquid crystal device, and FIG. 3 is a cross-sectional view of the liquid crystal device. The present invention is characterized in a mounting structure for a semiconductor device (IC) and a connecting structure for a flexible wiring board. Since the structure of a section for displaying images in the liquid crystal device is similar to that of a well-known type of liquid crystal device, electrode patterns formed on substrates constituting the liquid crystal device, and the like are schematically shown in FIGS. 1 and 2, and a detailed description thereof is omitted.

As shown in FIGS. 1, 2, and 3, in a passive matrix type liquid crystal device 1, a first transparent substrate 10 made of glass, quartz, plastic, or the like and a second transparent substrate 20 similarly made of glass, quartz, plastic, or the like are fixedly bonded with a predetermined clearance therebetween so as to hold a sealing material 30 therebetween. The sealing material 30 is provided with a break portion serving as a liquid crystal inlet 301 when injecting liquid crystal therethrough, and is sealed by a sealant 302 made of an ultraviolet-curing resin. Liquid crystal 5 is sealed in a liquid crystal sealing region 300 enclosed by the sealing material 30 between the first transparent substrate 10 and the second transparent substrate 20. The first transparent substrate 10 and the second transparent substrate 20 are provided, respectively, with electrode patterns 15 and 25 for driving which are made of transparent ITO (Indium Tin Oxide) films in stripes so as to extend in orthogonal directions. Driving signals are applied to the electrode patterns so as to drive liquid crystal at pixels. In a case in which the liquid crystal device is of a reflective or transflective type, one of the electrode patterns may be made of a reflective metal film of aluminum or the like.

Alignment layers 101 and 201 are formed, respectively, on the surfaces of the first transparent substrate 10 and the second transparent substrate 20. As the liquid crystal 5, various types of liquid crystals, such as STN (Super Twisted Nematic) type, may be used.

A pixel is formed by liquid crystal at the intersection of the two electrode patterns 15 and 25 to which voltage is applied from the electrode patterns. Since this embodiment adopts the passive matrix type liquid crystal device, one of the electrode patterns 15 and 25 functions as a scanning electrode to which a scanning signal is applied, and the other electrode pattern functions as a signal electrode to which on-voltage and off-voltage image signals are applied. Furthermore, polarizers 19 and 29 are stuck on the outer surfaces of the first transparent substrate 10 and the second transparent substrate 20. Between the transparent substrates 10 and 20 and the polarizers 19 and 29, a retardation film is interposed so as to cancel coloring caused in the liquid crystal layer, as necessary.

In the liquid crystal device 1 of this embodiment, since the second transparent substrate 20 is larger than the first transparent substrate 10, a portion thereof protrudes from the edge of the first transparent substrate 10. In the protruding portion 200 of the second transparent substrate 20, a flexible wiring board connecting region 80 is formed along the edge of the second transparent substrate 20, and an IC mounting region 70 is formed in parallel with and on the inner side of the flexible wiring board connecting region 80. The IC mounting region 70 is a region where a driving IC 7 for outputting driving signals to the electrode patterns 15 and 25 is mounted, and the flexible wiring board connecting region 80 is a region where a flexible wiring board 8 for supplying various signals and power from the outside to the driving IC 7 is connected to the second transparent substrate 20. The driving IC 7 serves to apply driving signals to the electrode patterns so as to drive pixels in the liquid crystal device, and is mounted in chip form on the transparent substrate by COG (Chip On Glass) method with its active surface opposing the substrate.

When the first transparent substrate 10 and the second transparent substrate 20 are bonded by the sealing material 30, the electrode patterns 15 formed on the first transparent substrate 10 are electrically connected to the ends of wiring patterns 94 extending from both ends of the IC mounting region 70 of the second transparent substrate 20 via an intersubstrate conducting material contained in the sealing material 30.

Figure 4:
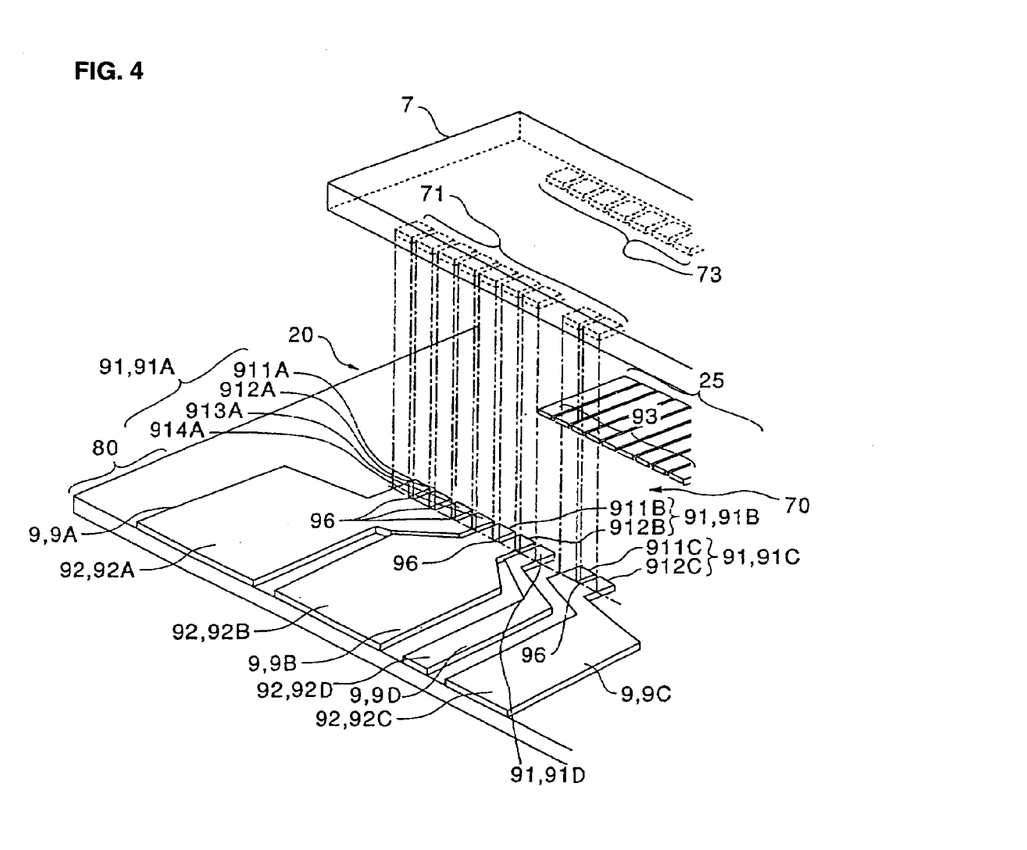
FIG. 4 is a perspective view showing a state in which a driving IC is mounted on an IC mounting region in a liquid crystal device according to a first embodiment of the present invention.
Figure 5:
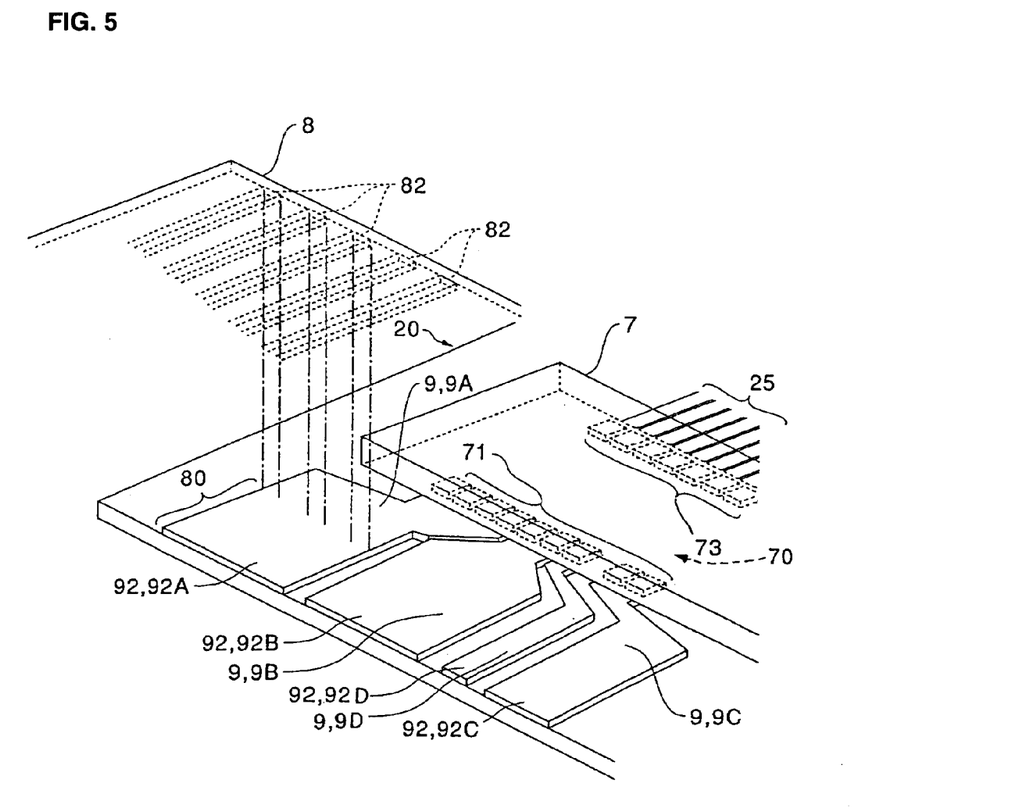
FIG. 5 is a perspective view showing a state in which a flexible wiring board is connected to a flexible wiring board connecting region of a second substrate in the liquid crystal device according to the first embodiment of the present invention.

In this embodiment, the IC mounting region 70 and the flexible wiring board connecting region 80 are generally structured, as shown in FIGS. 4 and 5 as partly enlarged views.

FIG. 4 is a perspective view showing a state in which the driving IC 7 is mounted on the IC mounting region 70 of the liquid crystal device 1 according to the first embodiment of the present invention, and FIG. 5 is a perspective view showing a state in which the flexible wiring board 8 is connected to the flexible wiring board connecting region 80. In the IC mounting region 70, an electrical connection between the driving IC 7 and the wiring patterns 25 and an electrical connection between the driving IC 7 and the intersubstrate conducting wiring patterns 94 are made. Since the connections are basically the same in structure, FIGS. 4 and 5 show only the electrical connection between the driving IC 7 and the wiring patterns 25. Illustration and description of the electrical connection between the driving IC 7 and the intersubstrate conducting wiring patterns 94 are omitted.

Referring to FIG. 4, the IC mounting region 70 and the flexible wiring board connecting region 80 are connected by wiring patterns 9 formed of a conductive film, such as an ITO film or an aluminum film, simultaneously with formation of the driving electrode patterns 25. The ends of the wiring patterns 9 placed inside the IC mounting region 70 form multiple first terminals 91 (a first terminal group). Multiple first electrodes 71 (a first electrode group) formed on the active surface of the driving IC 7 are connected to the first terminals 91. The first electrodes 71 serve to input signals and voltages from the flexible wiring board 8. The first electrodes 71 are usually shaped like protuberances so as to serve as bump electrodes.

In the second transparent substrate 20, the ends of the electrode patterns 25 placed inside the IC mounting region 70 form multiple third terminals 93. Since the third terminals 93 are formed in the same number and at the same pitch as those of third electrodes 73 formed on the active surface of the driving IC 7, the third electrodes 73 electrically contact the third terminals 93 in a one-to-one correspondence. The third electrodes 73 serve to output driving signals to the electrode patterns 25 so as to drive the liquid crystal. The third electrodes 73 are also usually shaped like protuberances so as to serve as bump electrodes.

As shown in FIG. 5, the ends of the wiring patterns 9 placed in the flexible wiring board connecting region 80 form multiple second terminals 92 (a second terminal group), and multiple second electrodes 82 (a second electrode group) formed on the flexible wiring board 8 are connected to the second terminals 92.

Referring again to FIG. 4, wiring patterns 9A, 9B, 9C of the plural wiring patterns 9, which supply voltages, such as a ground potential Vss and a high-voltage potential Vdd, from the flexible wiring board 8 to the driving IC 7, are formed so as to be wider than other wiring patterns 9 for transmitting signals, for example, a wiring pattern 9D, and are extended to the IC mounting region 70 and the flexible wiring board connecting region 80. Therefore, some of the first electrodes 71 of the driving IC 7 are collectively and electrically connected to each of the wiring patterns 9A, 9B, and 9C. Similarly, some of the second electrodes 82 of the flexible wiring board 8 are collectively and electrically connected to each of the wiring patterns 9A, 9B, and 9C.

Terminals 91A, 91B, and 91C of the first terminals 91, which are connected to the wiring patterns 9A, 9B, and 9C, are not entirely provided with conductive films for forming the first terminals 91 and the wiring patterns 9, and the portions thereof having no conductive films form slits 96. For this reason, the terminal 91A is divided into four terminals (divided terminals) 911A, 912A, 913A, and 914A in a comb-like form by slits 96, and the first electrodes 71 of the driving IC 7 are placed on the four terminals 911A, 912A, 913A, and 914A in a one-to-one correspondence so as to be electrically connected thereto. Similarly, the first terminal 91B is divided into two terminals (divided terminals) 911B and 912B in a comb-like form by a slit 96, and the first electrodes 71 of the driving IC 7 are placed on the two terminals 911B and 912B in a one-to-one correspondence so as to be electrically connected thereto. The first terminal 91C is also divided into two terminals (divided terminals) 911C and 912C in a comb-like form by a slit 96, and the first electrodes 71 of the driving IC 7 are placed on the two terminals 911C and 912C in a one-to-one correspondence so as to be electrically connected thereto.

In contrast, in this embodiment, the ends of the wiring patterns 9A, 9B, and 9C on the side of the flexible wiring board connecting region 80 form second terminals 92A, 92B, and 92C which are solid and even wider than a second terminal 92D formed at the end of the wiring pattern 9D, and some of the second electrodes 82 of the flexible wiring board 80 are collectively and electrically connected to each of the terminals 92A, 92B, and 92C. The second terminal 92D of the wiring pattern 9D has a size corresponding to that of each second electrode 82 of the flexible wiring board 80.

Figure 6A:
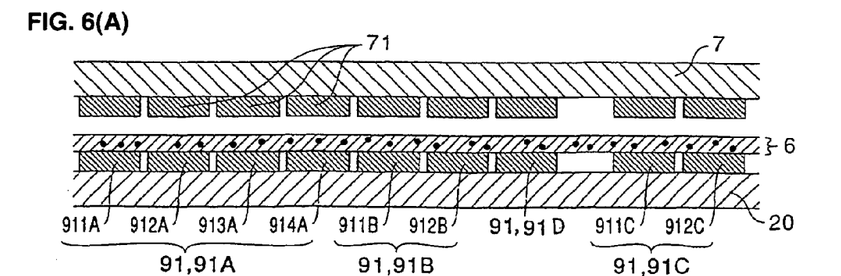
FIG. 6 is a process sectional view schematically showing a state in which the driving IC is mounted on the IC mounting region of the second substrate in the liquid crystal device according to the first embodiment of the present invention.
Figure 6B:
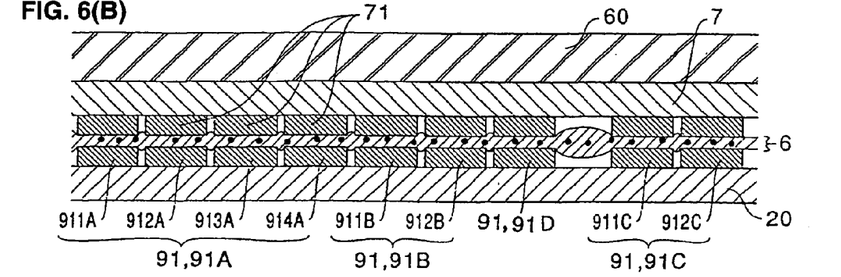
Figure 6C:
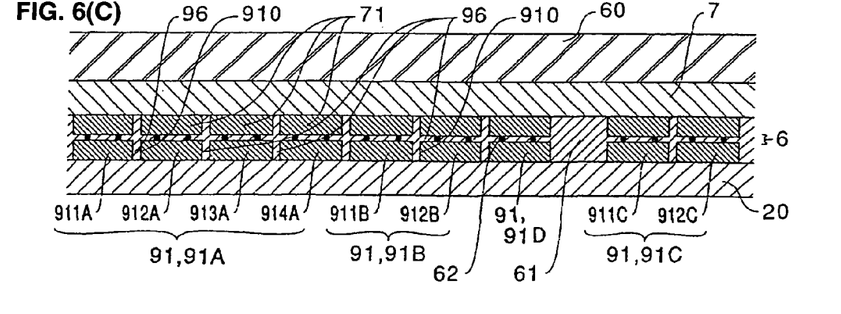

FIGS. 6(A) to 6(C) are process sectional views schematically showing a state in which the driving IC is mounted on the IC mounting region of the second substrate in the liquid crystal device according to the first embodiment of the present invention. FIGS. 6(A) to 6(C) are sectional views of the IC mounting region, taken along line B–B' in FIG. 1.

In the production procedure of the liquid crystal device 1 of this embodiment, an anisotropic conductive film 6 is used to mount the driving IC 7 on the second transparent substrate 20, as shown in FIG. 6(A). In this mounting method using the anisotropic conductive film 6, first, an anisotropic conductive film 6 is applied on the IC mounting region 70, or a sheet-like anisotropic conductive film 6 is placed on the IC mounting region 70. Then, the first electrodes 71 of the driving IC 7 are respectively aligned with the first terminals 91 formed on the second transparent substrate 20. In this state, as shown in FIG. 6(B), the driving IC 7 is heated and press-bonded to the second transparent substrate 20 by a head 60. As a result, as shown in FIG. 6(C), a resin component 61 contained in the anisotropic conductive film 6 is melted, and conductive particles 62 contained in the anisotropic conductive film 6 are crushed between the first terminals 91 and the first electrodes 71. For this reason, the first terminals 91 and the first electrodes 71 are electrically connected via the conductive particles 62, and the driving IC 7 is fixed on the second transparent substrate 20 in a state in which the resin component 61 contained in the anisotropic conductive film 6 is hardened. In this case, the melted resin component 61 enters the slits 96 dividing the first terminals 91, and is hardened in contact with side face portions 910 of the first terminals 91.

Since the electrical connection shown in FIG. 4 is made between the third terminals 93 in the IC mounting region 70 and the third electrodes 73 of the driving IC 7 simultaneously with the process described with reference to FIGS. 6(A), 6(B), and 6(C) and the manner thereof is the same as described with reference to FIGS. 6(A), 6(B), and 6(C), description thereof is omitted. A method for electrically connecting the second electrodes 82 of the flexible wiring board 80 and the second terminals 91 of the second transparent substrate 20, as shown in FIG. 5, is also similar to that described with reference to FIGS. 6(A), 6(B), and 6(C), and therefore, description thereof is omitted.

As described above, in this embodiment, since the first terminals 91A, 91B, and 91C are divided into a plurality of terminals 911A, 912A, 913A, 914A, 911B, 912B, 921C, and 922C by the slits 96, they are provided with pits and projections. Therefore, when the first terminals 91 and the first electrodes 71 are electrically and mechanically connected by the anisotropic conductive film 6, the resin component 61 contained in the anisotropic conductive film 6 fixedly bonds the IC 7 to the second transparent substrate 20 while it enters the pits (slits 96). For this reason, the area where the resin component 61 contacts the first terminals 91 is larger, by the areas of the side face portions 910 of the terminals 911A, 912A, 913A, 914A, 911B, 912B, 921C, and 922C, than that in the conventional mounting structure described with reference to FIGS. 9 and 10. Since this substantially increases the contact area between the resin component 61 and the second transparent substrate 20, bonding strength of the IC 7 to the second transparent substrate 20 is increased.

Figure 7:
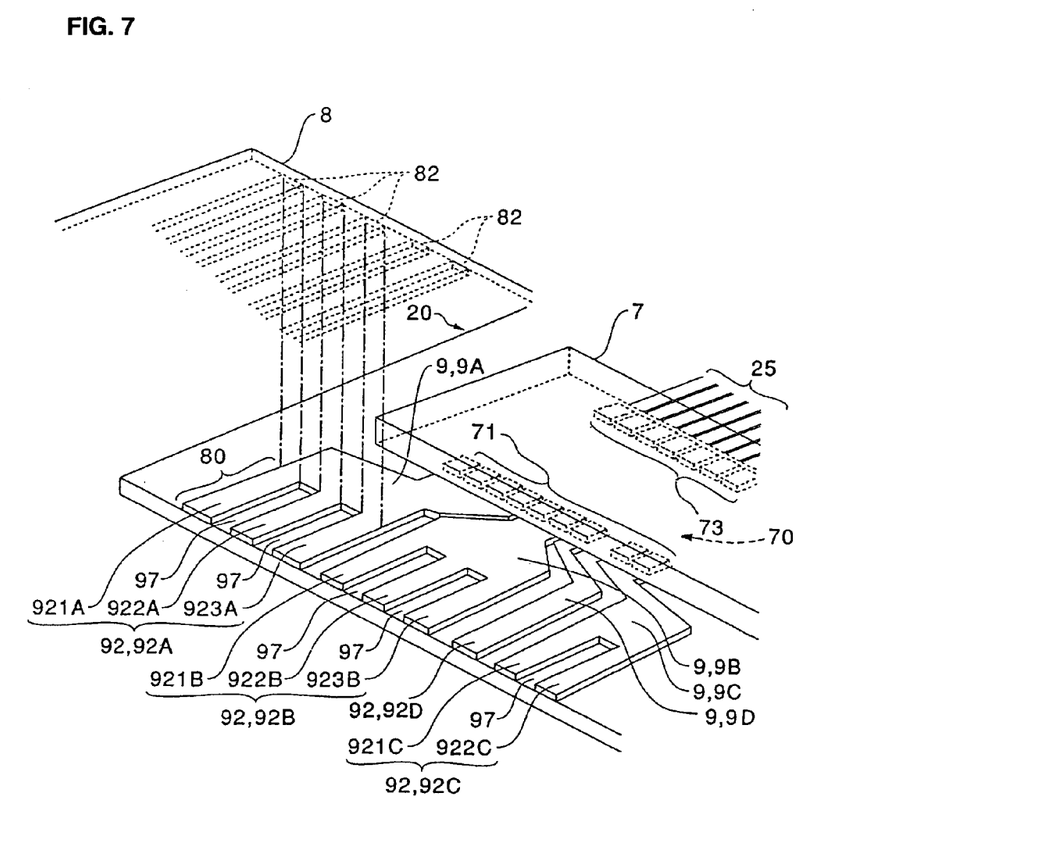
FIG. 7 is a perspective view showing a state in which a flexible wiring board is connected to a flexible wiring board connecting region of a second substrate in a liquid crystal device according to a second embodiment of the present invention.

While the ends of the wiring patterns 9A, 9B, and 9C placed in the flexible wiring board connecting region 80 form the second terminals 92A, 92B, and 92C, which are wide and solid, in the first embodiment, as shown in FIG. 5, the second terminals 92A, 92B, and 92C may also be divided into a plurality of terminals, as shown in FIG. 7.

That is, in this embodiment, among a plurality of wiring patterns 9 formed on a second transparent substrate 20, wiring patterns 9A, 9B, and 9C for supplying voltages, such as a ground potential Vss and a high potential Vdd, from a flexible wiring board 8 to a driving IC 7 are also considerably wide. At the ends (second terminals 92A, 92B, and 92C) of the wiring patterns 9A, 9B, and 9C, slits 97 are formed by portions having no conductive films. For this reason, the second terminal 92A is divided into three terminals (divided terminals) 921A, 922A, and 923A in a comb-like form by slits 97, and second electrodes 82 of the flexible wiring board 8 are placed on the three divided terminals 921A, 922A, and 923A in a one-to-one correspondence so as to be electrically connected thereto. The second terminal 92B is also divided into three terminals (divided terminals) 921B, 922B, and 923B in a comb-like form by slits 97, and second electrodes 82 of the flexible wiring board 8 are placed on the three divided terminals 921B, 922B, and 923B in a one-to-one correspondence so as to be electrically connected thereto. Furthermore, the second terminal 92C is also divided into two terminals (divided terminals) 921C and 922C in a comb-like form by a slit 97, and second electrodes 82 of the flexible wiring board 8 are placed on the two divided terminals 921A and 922C in a one-to-one correspondence so as to be electrically connected thereto. Since other structures are similar to those in the first embodiment, description thereof is omitted.

When the flexible wiring board 8 is connected to the flexible wiring board connecting region 80 of the second substrate 20 with such a configuration by using an anisotropic conductive film 6, since the second terminals 92A, 92B, and 92C are divided into a plurality of terminals 921A, 922A, 923A, 921B, 922B, 923B, 921C, and 922C by the slits 97, a resin component 61 contained in the anisotropic conductive film 6 fixedly bonds the flexible wiring board 8 to the second transparent substrate 20 while it enters the pits (slits 97). For this reason, the area of the resin component 61 in contact with the second terminals 92 is larger, by the areas of side face portions of the second terminals 921A, 922a, 923A, 921B, 922B, 921C, and 922C, than those in the first embodiment and the conventional example. Since this substantially increases the contact area, bonding strength of the flexible wiring board 8 to the second transparent substrate 20 is increased.

While the present invention is applied to the structures for COG (Chip on Glass) mounting of the driving IC 7 onto the second transparent substrate 20 in the first and second embodiments, it may also be applied to a structure for COF (Chip on Flexible Tape) mounting or TCP (Tape Carrier Package/TAB; Tape Automated Bonding) mounting of the driving IC 7 onto the flexible wiring board.

The driving IC 7 may be mounted on the first transparent substrate 10 by COG mounting, COF mounting, or TCP mounting so as to apply driving signals to the electrode patterns 15. In this case, it is also preferable to use the mounting structure in the first or second embodiment of the present invention.

While the anisotropic conductive film is of a thermosetting in the first and second embodiments, it may be of an ultraviolet-curing type.

While the present invention is applied to the passive matrix type liquid crystal device in the first and second embodiments, it may also be applied to an active matrix type liquid crystal device. Furthermore, the present invention is applicable not only to such liquid crystal devices, but also to electro-optical devices using an organic electrolumninescence device, and electro-optical devices, such as a PDP (Plasma Display Panel) and an FED (Field Emission Display).

Figure 8A:
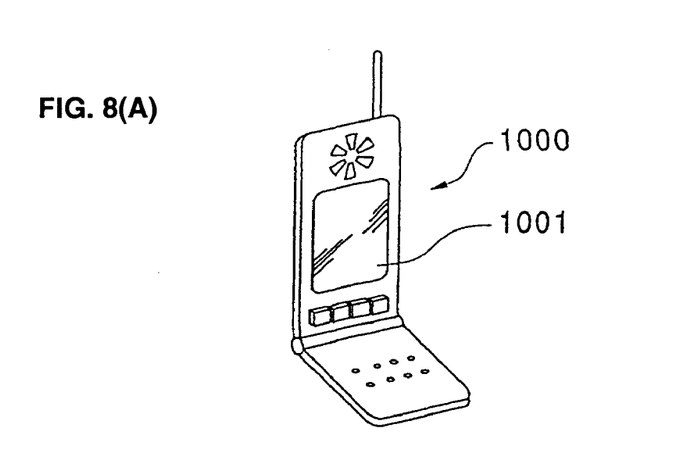
FIGS. 8(A), 8(B), and 8(C) are explanatory views of electronic apparatuses each having a liquid crystal device to which the present invention is applied.
Figure 8B:
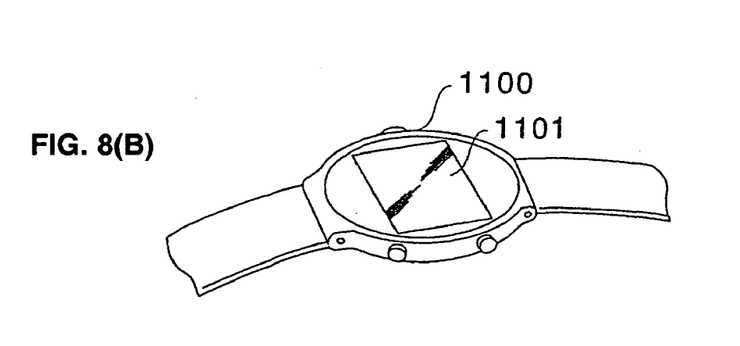
Figure 8C:
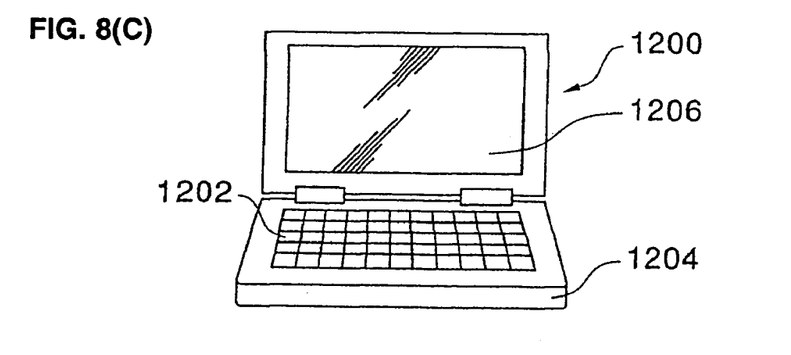

FIGS. 8(A), 8(B), and 8(C) are external views of electronic apparatuses using the liquid crystal device 1 to which the present invention is applied.

FIG. 8(A) is an external view of a portable telephone. In this figure, reference numeral 1000 denotes a main body of the portable telephone, and reference numeral 1001 denotes an image display device using the liquid crystal device 1 to which the present invention is applied.

FIG. 8(B) is an external view of a wristwatch type electronic apparatus. In this figure, reference numeral 1100 denotes a main body of the wristwatch, and reference numeral 1101 denotes an image display device using the liquid crystal device 1 to which the present invention is applied.

FIG. 8(C) is an external view of a portable information-processing device such as a word processor or a personal computer. In this figure, reference numerals 1200, 1202, 1206, and 1204 respectively denote an information processing device, an input section such as a keyboard, an image display device using the liquid crystal device 1 to which the present invention is applied, and a main body of the information processing device.

As described above, according to the present invention, since the first terminals are divided into a plurality of terminals by the slits, when the first terminals and the first electrodes are electrically and mechanically connected by an anisotropic conductive film, a resin component contained in the anisotropic conductive film fixedly bonds the IC to the substrate while it enters the pits (slits). For this reason, the area of the resin component in contact with the first terminals is larger, by the areas of side face portions of the first terminals, than that in the conventional mounting structure. Since this substantially increases the contact area, bonding strength of the IC to the substrate is increased.

What is claimed is:

1. A semiconductor device mounting structure for mounting a semiconductor device on a semiconductor mounting region of a substrate comprising:
 a group of first terminals provided at a first edge of the substrate that extend toward a second edge of the substrate into the semiconductor device mounting region of the substrate, the semiconductor device mounting region lying in a region inboard of said first edge; and
 a group of first electrodes provided on the semiconductor device to be electrically connected to said group of first terminals by an anisotropic conductive film;
 wherein each terminal of said group of first terminals includes a connection portion divided into an array of terminals by a slit at a position where said group of first electrodes is connected to said group of first terminals, said slit corresponding to a portion where a conductive film forming said group of first terminals is not provided; and
 wherein predetermined electrodes of said group of first electrodes are connected to each terminal constituting said array of terminals in a one-to-one correspondence so as to be electrically connected thereto.

2. The semiconductor device mounting structure according to claim 1, wherein the substrate is provided with a flexible wiring board connecting region provided at and extending toward said first edge of the substrate, said flexible wiring board connecting region having a group of second terminals, and a group of second electrodes on a flexible wiring board is electrically connected to said group of second terminals via an anisotropic conductive film, wherein each terminal of said group of second terminals includes another connection portion divided into an array of terminals by a second slit, the second slit formed at the another portion where a conductive film forming said group of second terminals is not provided.

3. The semiconductor device mounting structure according to claim 2, wherein predetermined electrodes of said group of second electrodes are placed on each terminal constituting said array of terminals in a one-to-one correspondence so as to be electrically connected thereto.

4. The electro-optical device having a semiconductor device mounting structure according to claim 1, wherein a plurality of electrode patterns extend on said substrate so as to supply a driving signal from said semiconductor device mounted on said semiconductor device mounting region to pixels.

5. An electronic apparatus having an electro-optical device according to claim 1, as a display section.

6. A device comprising:
a substrate having a mounting region;
a group of terminals provided at an edge of said substrate that extend inboard from said edge into said mounting region, each terminal of said group of terminals including connection portion divided into an array of spaced apart terminals;
a semiconductor device;
a group of electrodes provided on said semiconductor device; and
an anisotropic conductive film disposed between said substrate and said semiconductor device in said mounting region and conductively interconnecting said spaced apart terminals and said group of electrodes at a position where said connection portions of said group of terminals meets said group of electrodes, a resin component of said anisotropic conductive film occupying the spaces between said spaced apart terminals,
wherein predetermined electrodes of said group of electrodes are placed on each terminal constituting said array of spaced apart terminals in a one-to-one correspondence so as to be electrically connected thereto.

7. The device of claim 6, wherein said end portion including said array of spaced apart terminals is formed of a conductive film having a comb-like configuration.

8. A device comprising:
a substrate having a mounting region and a connecting region;
a group of terminals provided at an edge of said substrate, each terminal of said group of terminals including first connection portions that extend inboard from said edge into said mounting region, and second connection portions provided in said connecting region at said edge of said substrate;
the first connection portions of each terminal divided into an array of first spaced apart terminals and the second connection portions of each terminal divided into an array of second spaced apart terminals;
a semiconductor device including a group of first electrodes provided thereon;
a flexible wiring board including a group of second electrodes provided thereon; and
an anisotropic conductive film disposed between said substrate and said semiconductor device in said mounting region, and between said substrate and said flexible wiring board in said connecting region, said anisotropic conductive film conductively interconnecting said array of spaced apart terminals and said group of first electrodes and conductively interconnecting said array of spaced apart terminals and said group of second electrodes, a resin component of said anisotropic conductive film occupying the spaces between said first spaced apart terminals and the spaces between said second spaced apart terminals,
wherein predetermined electrodes of said group of first electrodes are placed on each terminal constituting said array of first spaced apart terminals in a one-to-one correspondence so as to be electrically connected thereto; and
predetermined electrodes of said group of second electrodes are placed on each terminal constituting said array of second spaced apart terminals in a one-to-one correspondence so as to be electrically connected thereto.

9. The device of claim 8, wherein said first portion including said array of first spaced apart terminals is formed of a conductive film having a comb-like configuration.

10. The device of claim 8, wherein said second portion including said array of second spaced apart terminals is formed of a conductive film having a comb-like configuration.

11. A device comprising:
a first substrate;
a wiring pattern including a plurality of terminals formed on the substrate, each terminal extending inboard from an edge of the first substrate and including connection portion that is divided into an array of several parts;
a semiconductor device mounted on the substrate;
an electrode provided on the semiconductor device such that the electrode is connected to at least one of the parts of the connection portion; and
an adhesive disposed between the end connection portion and the electrode,
wherein said electrode is placed on said at least one of the parts of the connection portion in a one-to-one correspondence so as to be electrically connected thereto.

12. The device according to claim 11, wherein the substrate comprises a flexible substrate.

13. The device according to claim 11, wherein the device is selected from a group consisting of an organic electroluminescence device, a liquid crystal device, a PDP and a FED.

14. The device according to claim 11, further comprising:
a second substrate;
a second electrode formed on the second substrate;
each terminal of the wiring pattern of the first substrate further including a second connection portion that is divided into an array of several parts, the second connection portion provided at an edge of the first substrate;
the second electrode being connected to at least one of the parts of the second connection portion; and
an adhesive disposed between the second connection portion and the second electrode,
wherein said second electrode is placed on said at least one of the parts of the second connection portion in a one-to-one correspondence so as to be electrically connected thereto.

15. The device according to claim 12, wherein the adhesive comprises an ACF.

16. A device comprising:
a first substrate;
a wiring pattern formed on the first substrate, the wiring pattern including a plurality of terminals, each terminal including first and second connection portions, the first and second connection portions being divided into an array of several parts;
a semiconductor device mounted on the first substrate;
an electrode provided on the semiconductor device such that the electrode is connected to at least one part of the array of several parts of the first connection portion of the terminal;
a second substrate;
a second electrode formed on the second substrate, the second electrode being connected to at least one of the parts of the array of several parts of the second connection portion of the terminal; and
an adhesive disposed between the electrode and array of several parts of the first connection portion, and between the array of several parts of the second connection portion of the terminal and the second electrode,
wherein said electrode and second electrode are placed on at least one part of said array of several parts of the first and second connection portions in a one-to-one correspondence so as to be electrically connected thereto.

17. The device according to claim 16, wherein either the first or the second substrate comprises a flexible substrate.

18. The device according to claim 16, wherein the device is selected from a group consisting of an organic electroluminescence device, a liquid crystal device, a PDP and a FED.

19. A liquid crystal device comprising:
a first substrate;
a second substrate opposing the first substrate, the second substrate having a protruding portion protruding relative to an edge of the first substrate;
a wiring pattern formed on the protruding portion of the second substrate that extends from the protruding portion toward the edge of the first substrate, the wiring pattern including a plurality of terminals, each terminal including a connection portion provided at an end of the terminal extended toward the edge of the first substrate, the connection portion is divided into an array of several parts;
a driving IC mounted on the protruding portion of second substrate;
an electrode pattern including a plurality of electrodes provided on the driving IC such that the electrode pattern is connected to the connection portion of the terminal; and
an adhesive disposed between the connection portion and the electrode,
wherein each of said electrodes of said electrode pattern are placed on at least one part of said array of several parts in a one-to-one correspondence so as to be electrically connected thereto.

20. The device according to claim 19, further comprising:
a flexible wiring substrate;
a second electrode formed on the flexible wiring substrate; and
a second connectionend portion provided with each terminal of the wiring pattern provided at an edge of the second substrate opposite the edge of the first substrate, the second connection portion and divided into an array of several parts;
wherein the second electrode is connected to at least one part of the array of several parts of the second connection portion in a one-to-one correspondence so as to be electrically connected thereto; and
an adhesive is disposed between the second connection portion of the wiring pattern and the second electrode.

21. The device according to claim 19, further comprising a second wiring pattern formed on the second substrate, the first wiring pattern providing one of a high voltage and a ground voltage with the driving IC, wherein a width of the first wiring pattern is wider than that of the second wiring pattern.

22. A liquid crystal device comprising:
a first substrate;
a second substrate opposing the first substrate, the second substrate having a protruding portion protruding relative to an edge of the first substrate;
a wiring pattern formed on the second substrate, the wiring pattern including first and second connection portions, the first and second connection portions being divided into an array of several parts;
a driving IC mounted on the second substrate;
an electrode arranged on the driving IC such that the electrode is connected to at least one of the parts of the first connection portion of the wiring pattern in a one-to-one correspondence so as to be electrically connected thereto;
a flexible wiring substrate;
a second electrode formed on the flexible wiring substrate, the second electrode being connected to at least one of the parts of the second connection portion of the wiring pattern in a one-to-one correspondence so as to be electrically connected thereto; and
an adhesive disposed between the first and second connection portions of the wiring pattern and the electrode of the driving IC and second electrode of the flexible wiring substrate.

23. The device according to claim 22, further comprising a second wiring pattern formed on the second substrate, the first wiring pattern providing one of a high voltage and a ground voltage with the driving IC, wherein a width of the first wiring pattern is wider than that of the second wiring pattern.

24. A semiconductor device mounting structure for mounting a semiconductor device on a substrates comprising:
a semiconductor mounting region provided on the substrate, the region located at a position of the substrate inboard from an edge of the substrate;
a group of first terminals provided on the substrate that extend into said semiconductor device mounting region of said substrate; and
a group of first electrodes provided with said semiconductor device so as to be electrically connected to said group of first terminals by an anisotropic conductive film;
wherein each terminal of said group of first terminals includes a connection portion divided into an array of terminals by a slit, said slit corresponding to a portion where a conductive film forming said group of first terminals is not provided; and
wherein predetermined electrodes of said group of first electrodes are placed on each terminal constituting said array of terminals in a one-to-one correspondence so as to be electrically connected thereto and some of the electrodes of said group of first electrodes are collectively and electrically connected to each terminal of said array of terminals.

25. A semiconductor device mounting structure for mounting a semiconductor device on a substrate, comprising:
a semiconductor mounting region provided on the substrate, the region located at a position of the substrate inboard from an edge of the substrate:
a group of first terminals provided on the substrate that extend into said semiconductor device mounting region; and
a group of first electrodes provided on said semiconductor device so as to be electrically connected to said group of first terminals by an anisotropic conductive film in said semiconductor mounting region;
wherein each terminal of said group of first terminals includes a connection portion divided into an array of terminals by a slit, said slit corresponding to a portion where a conductive film forming said group of first terminals is not provided;
wherein predetermined electrodes of said group of first electrodes are placed on each terminal constituting said array of terminals in a one-to-one correspondence so as to be electrically connected thereto;

wherein said substrate is provided with a flexible wiring board connecting region located at the edge of the substrate and having a group of second terminals, and a group of second electrodes on a flexible wiring board is electrically connected to said group of second terminals via an anisotropic conductive film, wherein each terminal of said group of second terminals includes a connection portion divided into an array of terminals by a second slit, the second slit formed at the portion where a conductive film forming said group of second terminals is not provided; and wherein some electrodes of said group of second electrodes are collectively and electrically connected to each terminal of said group of second terminals and predetermined electrodes of said group of second electrodes are placed on each terminal constituting said array of terminals in a one-to-one correspondence so as to be electrically connected thereto.

26. A mounting structure comprising:

a substrate including a flexible substrate mounting region at an edge of said substrate and a device mounting region located inboard from said edge;

a plurality of terminals provided on said substrate, each terminal of said plurality of terminals including a first portion located at said edge of said substrate in said flexible substrate mounting region, a second portion extending from said first portion inboard toward said device mounting region, and a third portion located in said device mounting region;

a flexible substrate including a plurality of first electrodes, said first electrodes of said flexible substrate connected to said first portions of said terminals in said flexible substrate mounting region; and a device including a plurality of second electrodes, said second electrodes of said device being connected to said third portions of said terminals in said device mounting region;

wherein said first portions of said terminals are divided into an array of spaced apart terminals; and each terminal of said spaced apart terminals of said first portion having a width that is less than a width of the second portion and the third portion.

27. The structure of claim 26, wherein said first electrodes of said flexible substrate are electrically connected to said terminals of said array of spaced apart terminals in a one-to-one correspondence.

28. The structure of claim 26, wherein the device is selected from the group consisting of a semiconductor device, a driving IC, and another substrate including a plurality of electrodes.

* * * * *